(12) United States Patent  
Smith et al.

(10) Patent No.: US 8,924,175 B2
(45) Date of Patent: Dec. 30, 2014

(54) APPARATUS AND METHOD FOR PERFORMING BURST TRIGGERING IN A TEST AND MEASUREMENT INSTRUMENT

(71) Applicant: Tektronix, Inc., Beaverton, OR (US)

(72) Inventors: Patrick A. Smith, Beaverton, OR (US); David L. Kelly, Portland, OR (US); Que T. Tran, Beaverton, OR (US); Shane A. Hazzard, Cornelius, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 13/862,035

(22) Filed: Apr. 12, 2013

(65) Prior Publication Data

US 2013/0221980 A1  Aug. 29, 2013

Related U.S. Application Data

(62) Division of application No. 12/718,777, filed on Mar. 5, 2010.

(60) Provisional application No. 61/158,682, filed on Mar. 9, 2009.

(51) Int. Cl.
    *G01R 13/02* (2006.01)
    *G01R 31/02* (2006.01)
    *G06F 19/00* (2011.01)

(52) U.S. Cl.
    CPC ............ *G06F 19/00* (2013.01); *G01R 13/0254* (2013.01); *G01R 31/02* (2013.01); *G01R 13/02* (2013.01)
    USPC .............................................. 702/68; 702/70

(58) Field of Classification Search
    CPC ............................. G01R 13/0254; H04L 7/08

USPC ........................................................ 702/68, 70
See application file for complete search history.

(56) References Cited

U.S. PATENT DOCUMENTS

| 6,725,170    | B1 * | 4/2004  | Hickman       | 702/106 |
| 2006/0279295 | A1 * | 12/2006 | Crook et al.  | 324/690 |
| 2008/0052028 | A1 * | 2/2008  | Pickerd et al.| 702/109 |

OTHER PUBLICATIONS

Agilent, "Agilent 6000 Series Oscilloscope: User's Guide", Jun. 2006, pp. 87-151, http://cp.literature.agilent.com/litweb/pdf/54684-97011.pdf.*

(Continued)

*Primary Examiner* — Jonathan C. Teixeira Moffat
*Assistant Examiner* — Regis Betsch
(74) *Attorney, Agent, or Firm* — Marger Johnson & McCollom PC (57) ABSTRACT

A test and measurement apparatus, system, and method for synchronizing an acquisition or triggering system to a specific burst of interest. The subject apparatus and method triggers on varying energy content of a signal qualified by time in the presence of high-frequency input signal bursts, by using an adjustable pulse width envelope detector, disposed in the signal path of the trigger circuitry, as a digital rectifier or to otherwise process and extract an envelope signal. An RF envelope probe having an analog envelope detector among other suitable components is disclosed. A method is implemented for isolating an interval of interest in a signal under test. An envelope detector circuit produces an envelope signal from the signal. Trigger circuitry receives the envelope signal from the envelope detector, and isolates the interval of interesting in the signal under test using the envelope signal.

4 Claims, 11 Drawing Sheets

(56) References Cited

OTHER PUBLICATIONS

Hewlett Packard, "User Guide HP 85718 B NADC-TDMA Measurements Personality Including Digital Demodulation", Feb. 1997, pp. 1-4, 2-12, chapter 3, 8-12, 9-36 and G-7; http://cp.literature.agilent.com/litweb/pdf/85718-90013.pdf.*

Hewlett Packard, "User Guide HP 85718 B NADC-TDMA Measurements Personality Including Digital Demodulation", Feb. 1997, pp. 1-4, 2-12, chapter 3, 8-12, 9-36 and G-7 and additionally 1-11; http://cp.literature.agilent.com/litweb/pdf/85718-90013.pdf.*

* cited by examiner

APPARATUS AND METHOD FOR PERFORMING BURST TRIGGERING IN A TEST AND MEASUREMENT INSTRUMENT

RELATED APPLICATION DATA

This application is a divisional of, and claims priority to, U.S. patent application Ser. No. 12/718,777, filed Mar. 5, 2010, which application claims the benefit of U.S. Provisional Patent Application No. 61/158,682, filed Mar. 9, 2009, herein incorporated by reference.

BACKGROUND

Digital or analog signal transmissions are used in virtually every aspect of modern society—in both wireless and wired applications. For example, cell phone usage is rapidly increasing around the world. Developing countries are finding it less expensive to invest in cellular phone systems than to install the copper wire or fiber optic infrastructure that more developed countries have used. Easy-to-use wireless networks have enabled increased laptop and smart phone usage at speeds only once achieved over wired networks. Traditional wired networks, which were conventionally adapted for powerful desktop or workstation computer systems, are now supporting myriad portable devices and an ever expanding Internet.

Advances in computer and storage devices have also pushed processing and transmission speeds to previously unexpected levels. Systems employing high-speed serial data communication protocols are becoming prolific. For example, storage devices are commonly using high-speed and low cost interfaces such as the Serial Advanced Technology Attachment (SATA) storage protocol. High-speed communication busses are also incorporating improved technologies such as Peripheral Component Interconnect (PCI) motherboard-level interconnection protocols (e.g., PCI Express®), among others, and have provoked new high-speed computing devices into the marketplace at steadily lower price points. Moreover, in a post 911 world, usage of wireless communication, security requirements, and low power circuit design is spreading widely.

Because of the high-bandwidth and multiple use nature of these signals, the transmission of digital or analog signals can be bursty. For example, many types of Radio Frequency (RF), radar, and high speed digital transmitters do not operate continuously, but rather, they often transmit a burst of information for a period of time, followed by a gap having little or no information. However, conventional test and measurement devices are deficient in the area of isolating and analyzing bursts and/or gaps between bursts of specific length, or otherwise detecting and measuring other aspects of high-frequency signals. As a result of random burst lengths, and in some cases, in the presence of a very high-frequency carrier signal—existing methods of triggering, such as edge trigger, cannot isolate specific bursts. Therefore, it is difficult or impossible to diagnose problems in the signal transmissions or to identify time intervals of interest.

SUMMARY

Embodiments of the subject invention synchronize an acquisition or triggering system to a specific burst of interest. The subject apparatus, system, and method trigger on varying energy content of an envelope signal qualified by time in the presence of high-frequency input signal bursts, by using an adjustable pulse width "sliver" circuit as a digital rectifier or envelope detector.

In one example embodiment, a test and measurement instrument includes an input terminal to receive a signal under test, an envelope detector circuit coupled to the input terminal and structured to receive the signal under test, rectify the signal, or otherwise produce an envelope signal from the signal under test, and trigger circuitry coupled to the envelope detector circuit. The trigger circuitry may be structured to isolate a burst in the signal under test using the envelope signal. In some embodiments, the envelope detector circuit includes a digital sliver circuit for detecting the envelope signal. In other embodiments, the envelope detector circuit includes an analog circuit.

In another example embodiment, the test and measurement system comprises an oscilloscope including trigger circuitry and an envelope probe attachable to an input terminal of the oscilloscope. The envelope probe may include a power splitter to divide a signal under test into first and second signals, and an envelope detector to receive the first signal and to produce an envelope signal from the first signal. Moreover, the oscilloscope may be structured to receive and process the envelope signal and the second signal, and the trigger circuitry may be structured to receive and process the envelope signal.

In yet another example embodiment, a method is implemented for isolating an interval of interest in a signal under test. The method may include receiving the signal under test at a terminal of a test and measurement device. Thereafter, an envelope detector circuit produces an envelope signal from the signal under test. Trigger circuitry receives the envelope signal from the envelope detector, and isolates the interval of interesting in the signal under test using the envelope signal.

DETAILED DESCRIPTION

A typical Radio Frequency (RF) modulated signal can have a carrier signal with a frequency in excess of 18 GHz. Even though a test and measurement instrument such as a high-end oscilloscope might accommodate the high frequency carrier signals, conventional triggering systems do not trigger to the bandwidth of the oscilloscope. For example, triggering circuitry effectively operates at a lower frequency, perhaps up to about ⅔ or ¾ of the bandwidth of the test and measurement instrument. Triggering speeds beyond such are not as practical because of numerous trigger modes, which can consume significant amounts of power. Nevertheless, it would be desirable to isolate bursts of data, or gaps of data, having particular widths, or falling inside or outside of predefined bounds. Moreover, it would be desirable to isolate, analyze, and calibrate any kind of bursty data.

In addition, there are other types of signals that can be difficult to isolate. For example, systems employing high speed serial data communication such as SATA and PCI Express® often turn transmitters off to save power. SATA has a bus state known as Out of Bounds (OOB) signaling where short signaling pulses appear as bursts. In this situation, the "carrier" is the non-return-to-zero (NRZ) serial bit stream. It would be desirable to isolate envelopes of specific widths or otherwise select particular OOB pulses of interest.

Figure 1:
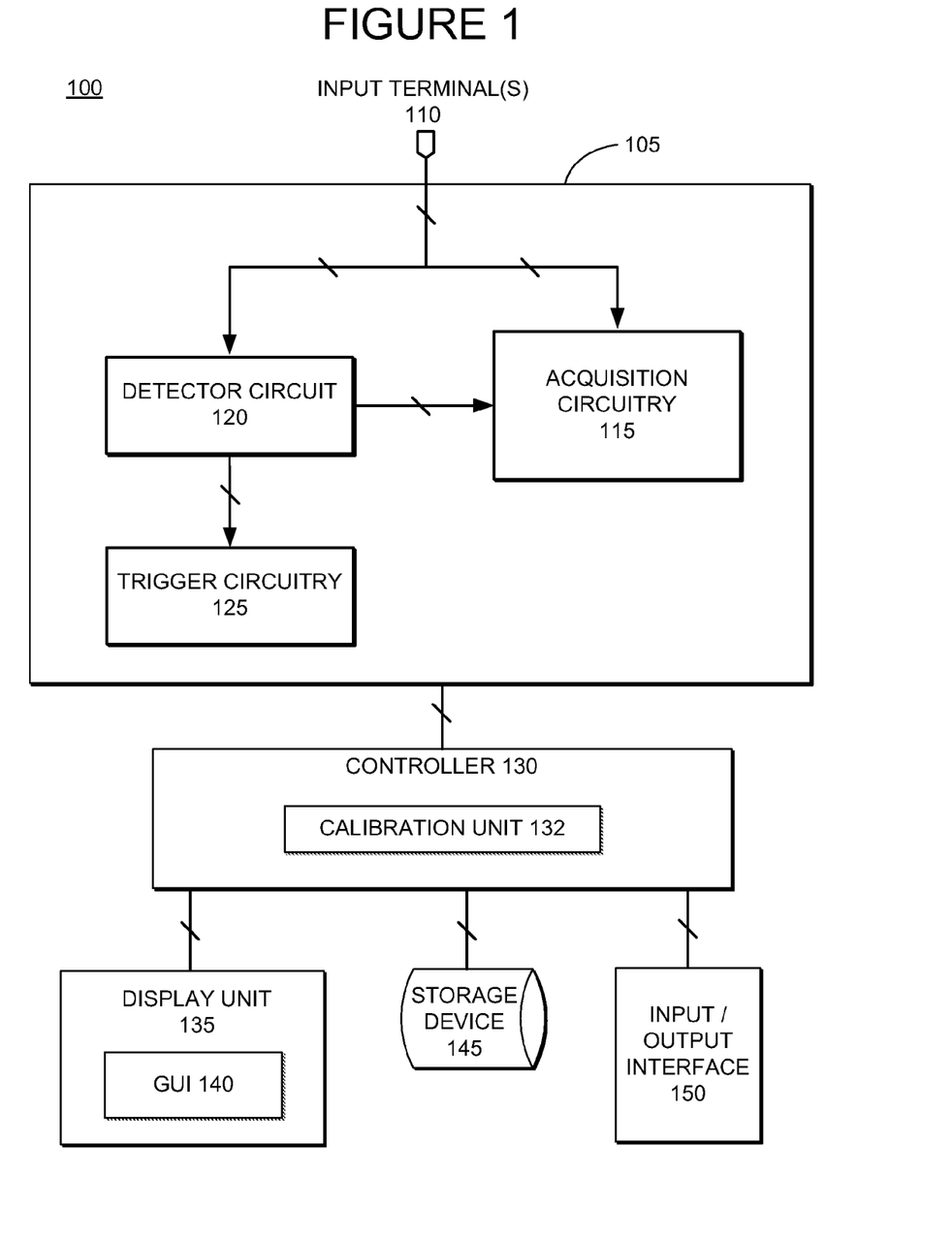
FIG. 1 illustrates a block diagram of a test and measurement instrument including a detection, acquisition, and trigger unit, a controller, a display unit, and a storage device according to an example embodiment.

FIG. 1 illustrates a block diagram of a test and measurement instrument 100 including a detection, acquisition, and trigger unit 105, a controller 130, a display unit 135, and a storage device 145, according to an example embodiment. The test and measurement instrument 100 may be a digital oscilloscope, for example, and for the sake of brevity but not limitation, will generally be referred to as such. The oscilloscope 100 may have multiple channels or inputs suitable for use with various embodiments as described herein. Although the oscilloscope may have a single input terminal 110, inventive aspects described are equally applicable to an oscilloscope having four inputs, or any number of inputs.

The detection, acquisition, and trigger unit 105 may include a detector circuit 120, trigger circuitry 125, and acquisition circuitry 115. The detector circuit 120 may include a digital envelope detector or an analog envelope detector to rectify or otherwise process the signal under test, as will be described in more detail below. While the detector circuit 120 is shown to be directly coupled to the input terminal(s) 110, it should be understood that other circuit components can be included between the detector circuit 120 and the input terminal(s) 110, or disposed between other components of oscilloscope 100. An electrical signal under test is received at one or more of the input terminals 110. The detector circuit 120 receives the signal under test and produces an envelope signal from the signal under test.

Trigger circuitry 125 is coupled to the detector circuit 120. The trigger circuitry 125 isolates an interval of interest within the signal under test using the envelope signal. For example, bursts or gaps of data that are within or outside of predefined bounds can be isolated by triggering on the envelope signal. Acquisition circuitry 115 is coupled to the input terminal(s) 110 and the detector circuit 120. The acquisition circuitry 115 is structured to acquire and process the signal under test so that it can be displayed using display unit 135, stored on device 145, or otherwise transmitted through input/output interface 150 for further analysis or post processing. In addition, the acquisition circuitry 115 can receive the envelope signal from the detector circuit 120 and display the envelope signal using display unit 135, store data associated with the envelope signal to storage device 145, or otherwise transmit the data through input/output interface 150 for further analysis or post-processing. The envelope signal may be displayed adjacent to or overlapping with the signal under test.

The detection, acquisition, and trigger unit 105 may be coupled to the controller 130. The controller 130 is coupled to the display unit 135, and processes the signal under test, the envelope signal, or other sampled data streams provided by the unit 105 for display by the display unit 135. The controller 130 may also store the data to the device 145, or otherwise transmit the data through input/output interface 150 to be analyzed or post-processed by a data consumer such as third party software. For example, given desired time per division and volts per division display parameters of the oscilloscope 100, the controller 130 may modify and then render the raw data associated with acquired data stream to produce a corresponding waveform image having the desired time per division and volts per division parameters.

The calibration unit 132 may convert the type of units for which a signal is displayed according to a user selection. In other words, the calibration unit 132 can provide gain factors and unit conversion to make the readouts of the signals intuitive, useful, and traceable to the customer's source. For example, a signal under test such as an acquired input carrier waveform can be displayed in Volt units, while the envelope signal can be displayed in power ratio decibel units (dBm), with logic applying the appropriate gain factors such that the displayed envelope value in dBm matches the measured input signal power. It should be understood that the envelope signal can be displayed in other units such as decibel micro volts (dBµV) or watts (W), among other suitable units.

The display unit 135 may have associated therewith a graphical user interface (GUI) 140, which will be described in further detail below. Any of the detection, acquisition, and trigger unit 105, the controller 130 including the calibration unit 132, and the display unit 135 including the GUI 140, may exist in or be implemented by hardware, software, firmware, or by any combination thereof.

Figure 2:
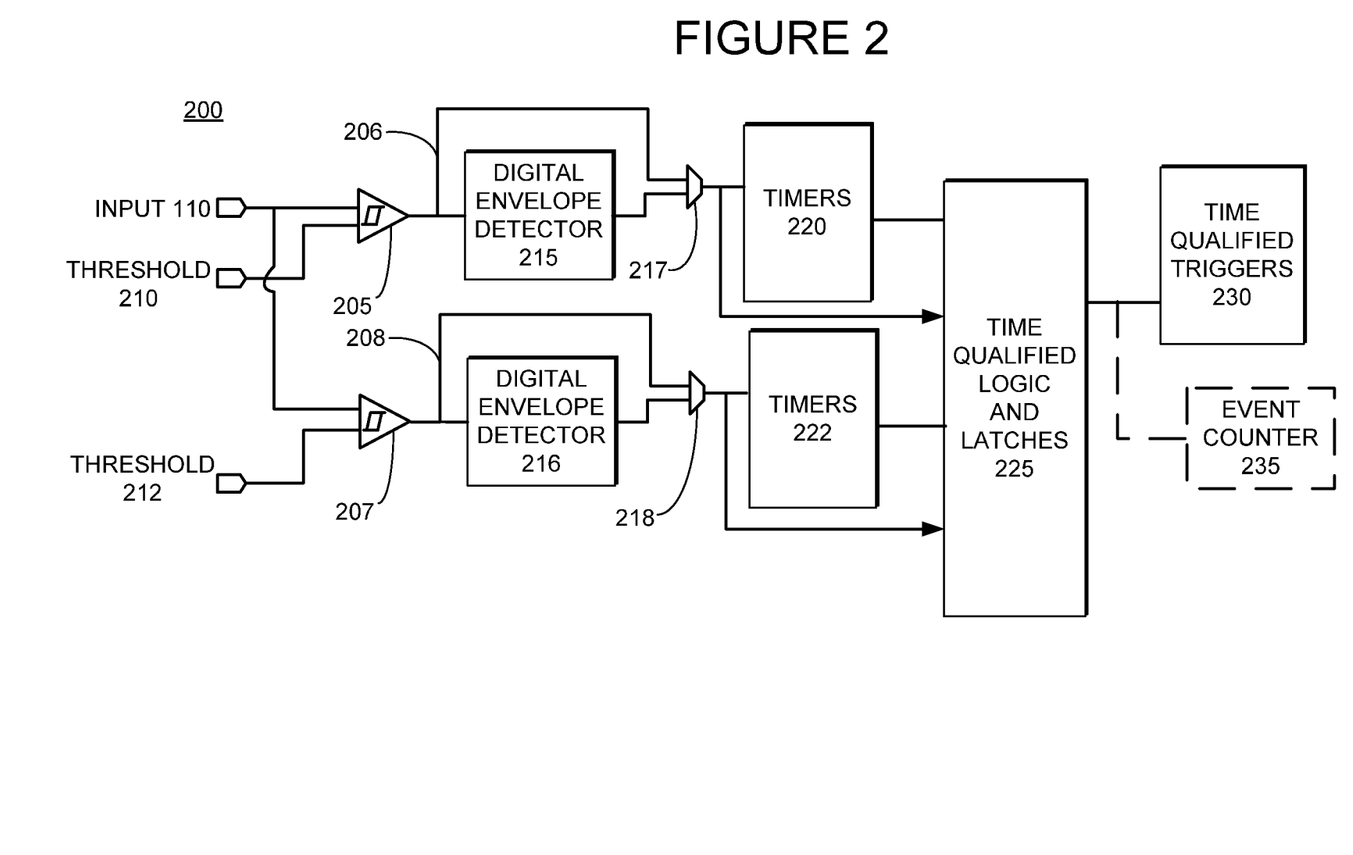
FIG. 2 illustrates digital envelope detectors and other circuit components in accordance with an example embodiment of the invention.

FIG. 2 illustrates a simplified block diagram 200 including digital envelope detectors 215, 216 and other circuit components in accordance with an example embodiment of the invention. The digital envelope detector 215 reshapes the input signal in such a way that when it is routed to time-qualified trigger types, such as pulse width or glitch trigger, it enables the isolation of the features of the burst-laden input signal. For example, applying the reshaped or envelope signal to the pulse width trigger with a specified polarity, such as a positive polarity, provides the ability to trigger at the end of a burst of a specific time width. Similarly, applying the envelope signal to the pulse width trigger with a different polarity, such as a negative polarity, provides the ability to trigger at the end of a gap with a specific time width.

In some embodiments, trigger circuitry such as the time qualified logic and latches 225 and time qualified triggers 230 are structured to receive the envelope signal from the digital envelope detector 215, and isolate bursts and/or gaps in the signal under test. The isolated bursts and/or gaps can have defined widths corresponding to a pulse in the envelope signal. The defined widths can correspond to a range of widths within predetermined bounds, or a range of widths outside of predetermined bounds.

More specifically, applying the envelope signal to an edge trigger positive-slope circuit provides the ability to trigger on the start of bursts of any width, while applying it to an edge trigger negative-slope circuit will cause the trigger at the end of a burst of any time width. In some embodiments, the trigger events provided by the digital envelope detector 215 and timers 220 can be used with Tektronix Pinpoint® A- and B- and Reset Event Sequences to trigger on specific combinations of bursts of same or different durations, or in combination with other trigger events. While the features and trigger events provided by the envelope detector can be added to, or comprise a subset of, the features of the Tektronix Pinpoint® triggering system, such association is not required, and the features and/or trigger events associated with the envelope detector can be accessed or displayed separately, or otherwise provided in a "standalone" configuration.

For example, a possible application is to trigger on the fourth 100 nanoseconds (ns) wide burst that occurs after the first 50 ns burst. A second example is that multiple detectors and timers may be used to trigger on a burst or gap of one length followed by a burst or gap of a second length. A third example is to combine these envelope and timer events with other Pinpoint® event types to trigger on the 100 ns burst that occurs at least 5 milliseconds (ms) after, but not more than 10 ms after, a timeout event on a second non-burst signal. In addition, event counter 235 can be used to count a number of consecutive bursts or gaps, or the elapsed time of the burst or gap itself, and cause a trigger event based on the count.

By disposing the digital envelope detector circuit 215 in front of the analog timers 220, the high-frequency signal bursts can be filtered and the sections of interest of the input signal can be triggered and isolated without violating minimum timer reset specifications. A multiplexor 217 can select between the output of the digital envelope detector 215 and the output of the comparator 205 via path 206. The comparator 205 can receive the input signal 110 and reference the signal to a threshold voltage 210, such as ground.

A second digital envelope detector circuit 216 can be disposed in the logic path between the input 110 and the trigger circuitry. The second digital envelope detector 216 and the comparator 207 operate in a similar manner to that described above with reference to the detector 215 and the comparator 205. A multiplexor 218 can select between the output of the digital envelope detector 216 and the output of the comparator 207 via path 208, and transmit the selection to either the timers 222 or the logic and latches 225. The threshold voltage 212 can be the same as or similar to the threshold voltage 210 discussed above. While not as accurate as an analog envelope detector, incorporating a second digital envelope detector enables certain trigger types such as triggering on rise times, fall times, or multiple edges because discrete levels of the signal can be detected. It should be understood that a single envelope detector, or two or more envelope detectors, along with other various circuit components, can be implemented in various embodiments without departing from the intended scope of the invention.

Figure 3A:
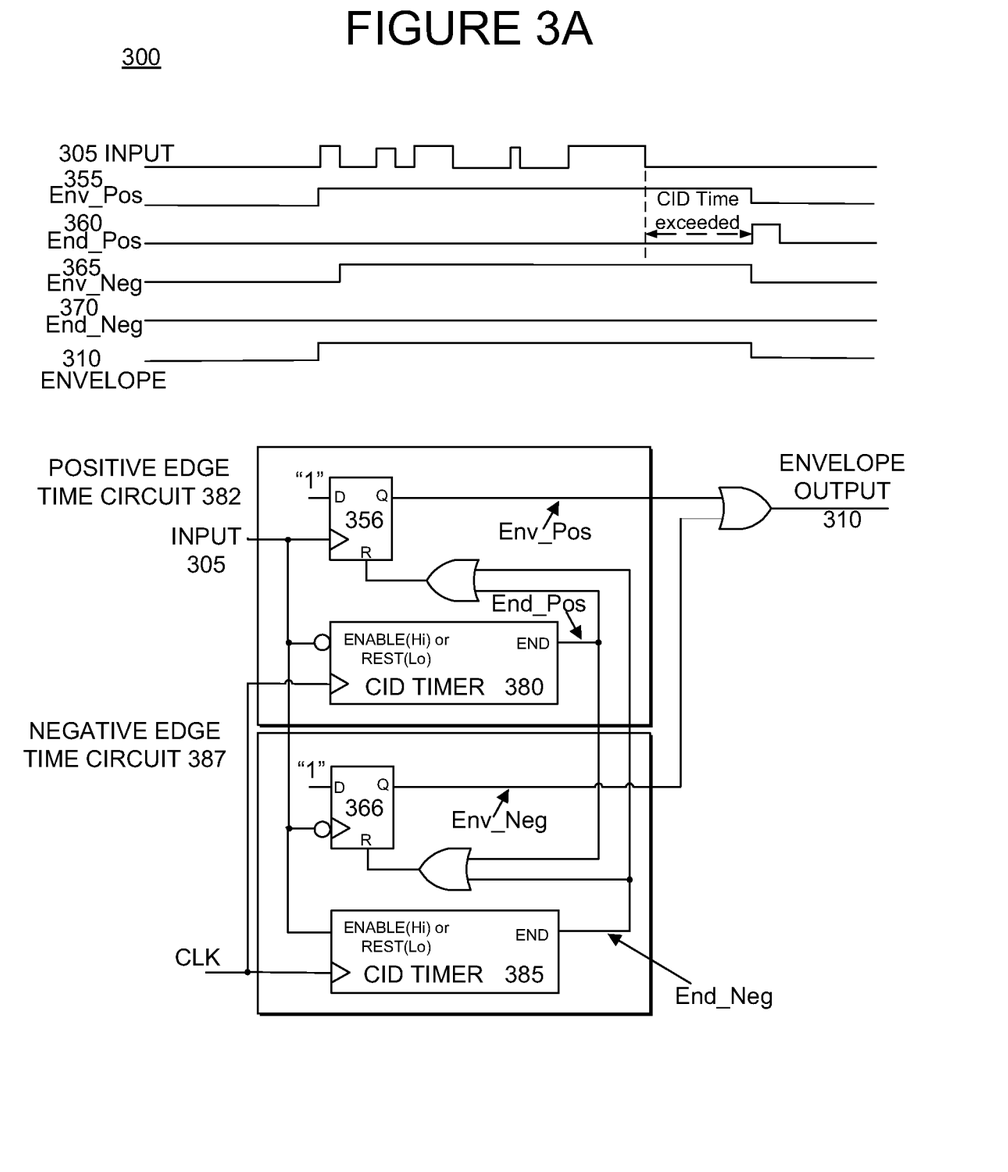
FIG. 3A illustrates an example embodiment of a digital envelope detector.

FIG. 3A illustrates an example embodiment of a digital envelope detector 300. The digital envelope detector 215 (of FIG. 2) may include components of circuit 300. The digital envelope detector 300 can be used with serial data. The serial data can have a number of consecutive identical digits (CID), the value of which can be known. The known number of consecutive identical digits can be programmed into a timer, so the proper end of the data burst can be detected. The input signal 305 (either edge transition) at the beginning of the burst will cause the Env_Pos 355 or Env_Neg 360 to be latched and thus the ENVELOPE signal 310 will go HIGH. A HIGH state of the input signal 305 will reset the positive edge CID timer 380 of positive edge time circuit 382, and a LOW state on input 305 will cause the CID timer 380 to start. If the input signal 305 goes HIGH before the CID timer 380 times out, the timer 380 will be reset. If the CID timer 380 times out, then the Env_Pos 355 and Env_Neg 365 signals associated with latches 356 and 366, respectively, are reset and the end of the burst has been detected. The negative edge timer 385 of negative edge time circuit 387 works in a similar fashion as the positive edge timer 380, although on the negative edges rather than the positive edges.

If the input signal is 8b/10b encoded data then the longest CID is 5 bits in length and if the input signal is 64b/66b encoded data then the longest CID is 65 bits in length. The reset signal is pulsed to ensure that the circuit is ready for the next data burst. The digital envelope detector 300 can be used with RF Burst signals or high speed serial data, or both. Either of the CID timers 380 and 385 can have a second purpose, namely, to simulate an analog decay. In other words, the CID timers can be programmed to simulate, or otherwise mimic, an analog decay time.

Figure 3B:
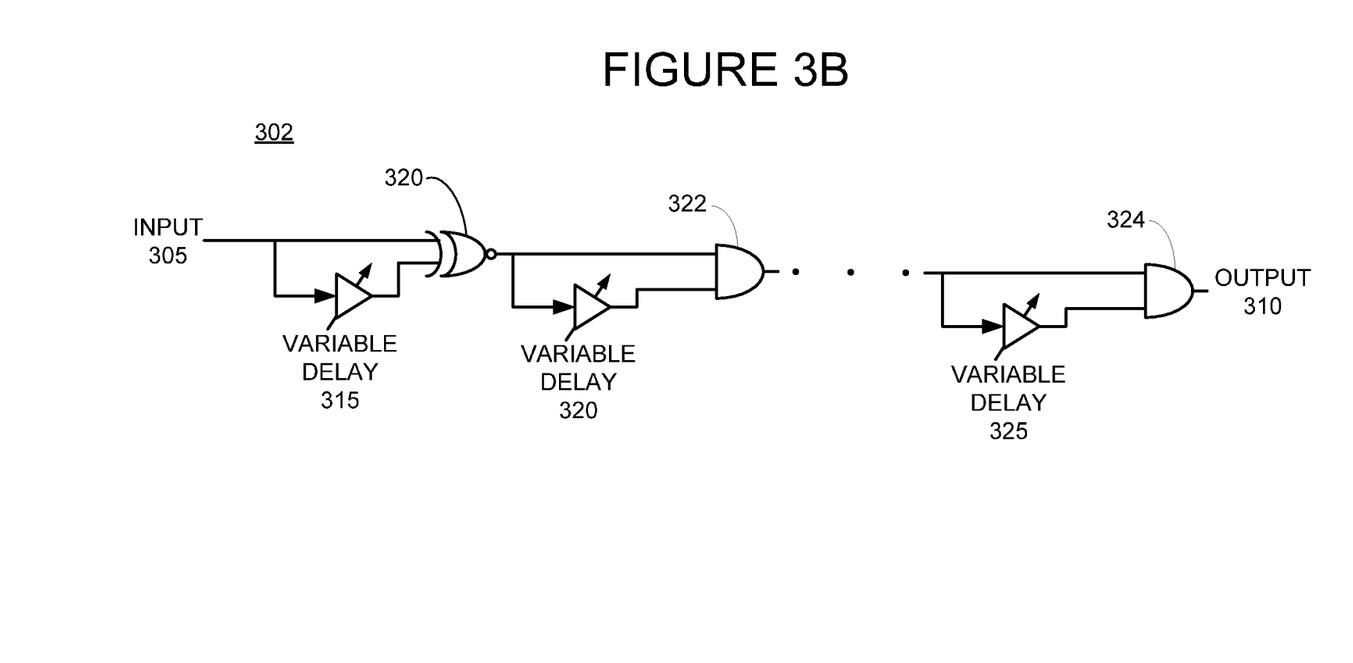
FIG. 3B illustrates an example embodiment of a sliver circuit.

FIG. 3B illustrates an example embodiment of a sliver circuit 302. The digital envelope detector 215 (of FIG. 2) may include the sliver circuit 302. The sliver circuit 302 is sometimes referred to herein as the digital envelope detector. The sliver circuit 302 includes a sliver detection portion (e.g., logic gate 320 and variable delay 315) and a pulse stretcher portion (e.g., logic gates 322, 324 and variable delays 320, 325, etc.). When an input pulse of the input 305 is shorter than the delay, the sliver circuit 302 stretches the pulse. In one operating mode, an output of the sliver circuit produces a sliver (i.e., a short pulse) when its input is toggled. However, if its input 305 toggles faster than the sliver circuit can handle (i.e., its input pulse width is narrower than the intended sliver width), then a different operating mode results, and its output 310 remains HIGH. In other words, if the frequency of the input signal (e.g., carrier signal) is relatively higher than the delay of the sliver circuit, then the sliver circuit 302 operates to eliminate the carrier signal and to produce the envelope signal.

Bursty signals switch rapidly between high-frequency regions (e.g., fast serial data or RF carriers) and low, or no, frequency regions (e.g., gaps between signal bursts). The output 310 of the sliver circuit 302 will be HIGH when the burst signal is present and LOW during a gap, thus behaving like an envelope detector. The sliver circuit 302 is structured to produce the envelope signal using the signal under test received through input 305 and the delayed signal received from the delay circuit 315, stretch the pulse of the envelope signal, and output the envelope signal at output 310. While variable delays 315, 320, and 325 are illustrated, it should be understood that fixed delays or a combination of variable and fixed delays are also possible. Moreover, although certain logic gates are illustrated such as XNOR gate 320 and AND gates 322 and 324, it should be understood that combinations of different logic gates or multiplexors can produce an equivalent effect without departing from the purpose and scope of the various embodiments of the invention.

Figure 4:
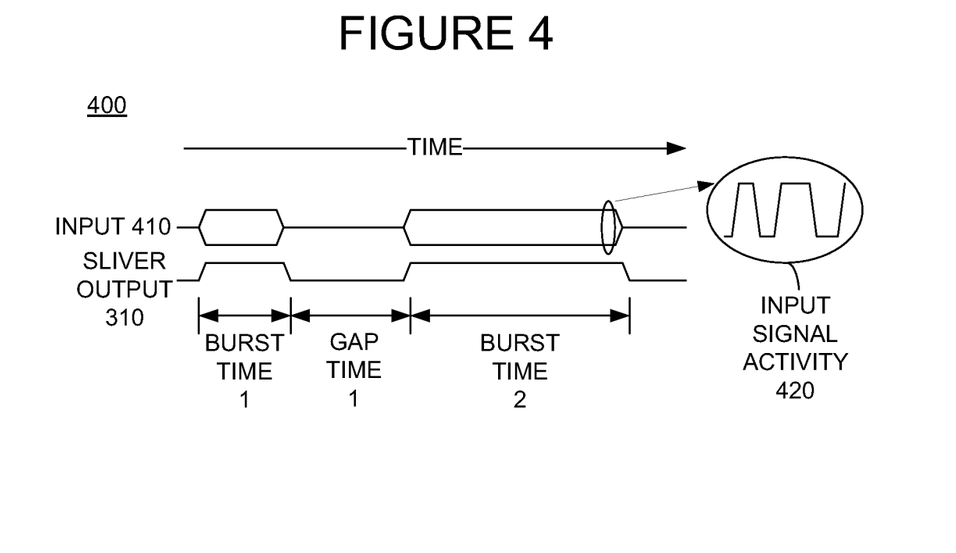
FIG. 4 illustrates a use of the sliver circuit to filter high-frequency signal bursts in accordance with various embodiments of the subject invention.

FIG. 4 illustrates waveforms 400 including a use of the digital envelope detectors 300 or 302 to filter high-frequency signal bursts in accordance with various embodiments of the subject invention. Users of oscilloscope 100 may be desirous to isolate intervals of interest, including for example, input signal activity 420 of the input signal 410, in the presence of high-frequency bursts. A time qualification circuit, such as 225 or 230 of FIG. 2, can use the output 310 of the digital envelope detectors 300 or 302 to provide signal isolation/triggering for conditions such as: signal burst width, time between bursts, burst counts, among other possibilities. For example, bursts of a specific length can be counted, such as, trigger on 3$^{rd}$ 100 ns wide burst.

Sections of the input signal 410 can be identified by extracting and analyzing the signal energy of the envelope. More specifically, a burst corresponding to burst time 1, gap time 1, or burst time 2, as shown in FIG. 4, can be identified and isolated using the envelope signal of the sliver output 310. While certain bursts and gaps in the high-frequency input signal 410 under test are illustrated in FIG. 4, it should be understood that any number and combination of bursts and gaps can occur, any of which can be isolated using the circuits and methods described herein.

Figure 5:
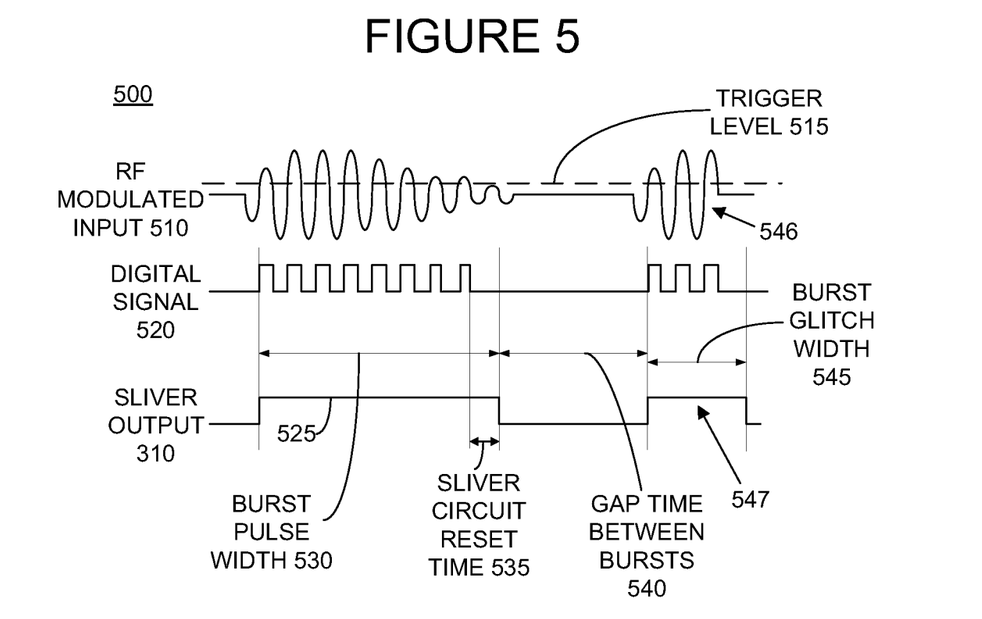
FIG. 5 illustrates other uses of the sliver circuit to filter high-frequency signal bursts in accordance with various embodiments of the subject invention.

FIG. 5 illustrates waveforms 500 including other uses of the digital envelope detectors 300 or 302 (of FIGS. 3A and 3B) to filter high-frequency signal bursts in accordance with various embodiments of the subject invention. In this example embodiment, an RF modulated input 510 having a high-frequency carrier wave is received by oscilloscope 100. A trigger level 515 can be configured by a user of the oscilloscope. Other types of triggering criteria can be selected by the user (not shown). The RF modulated signal can be converted to or otherwise represented by a digital signal 520. The digital envelope detector 300 or 302 receives either the RF modulated signal 510 or the digital signal 520 and produces the envelope signal 525 on the output 310 of the sliver circuit.

A width of a burst in the RF modulated input signal corresponds to the burst pulse width 530. The digital envelope detector 300 or 302 produces a pulse in the envelope signal 525 corresponding to the burst. The pulse can include the sliver circuit reset time 535.

Conversely, a width of a gap in the RF modulated input signal corresponds to the gap time between bursts 540. The digital envelope detector 300 or 302 produces an opposite pulse in the envelope signal 525 corresponding to the gap. In some scenarios, the RF modulated input signal 510 may contain a burst "glitch." The digital envelope detector 300 or 302 can detect the burst glitch 546 by producing a pulse 547 having a relatively short width 545. Upon detecting the relatively short width 545, a trigger event can be caused and the burst glitch 546 displayed.

Various types of triggers can be applied to isolate intervals of interest in the input signal using the digital envelope signal. In some embodiments, the trigger circuitry is structured to receive the envelope signal and to count a plurality of bursts in the signal under test corresponding to a plurality of pulses in the envelope signal. In other embodiments, the trigger circuitry is structured to isolate one of the plurality of bursts when the count exceeds a threshold. In another embodiment, the trigger circuitry is structured to receive the envelope signal and to isolate a burst glitch in the signal under test using the envelope signal. In still another embodiment, the trigger circuitry is structured to receive the envelope signal and to isolate a burst runt in the signal under test using the envelope signal.

In some embodiment, the trigger circuitry is structured to receive the envelope signal and to timeout after a period of time during which no burst is detected using the envelope signal. The trigger circuitry may be structured to receive the envelope signal and to isolate a fall time in the envelope signal. The fall time may be selected by the user to be within predetermined bounds, or outside of predetermined bounds. Similarly, the trigger circuitry may be structured to receive the envelope signal and to isolate a rise time in the envelope signal within or outside of predetermined bounds. In yet another example embodiment, the trigger circuitry is structured to receive the envelope signal and to cause a trigger event in association with the burst based on a trigger level set in relation to the envelope signal. It should be understood that other types of triggers, besides those explicitly mentioned, may be applied to the envelope signal to isolate sections of interest in the signal under test.

Figures 6A, 6B:
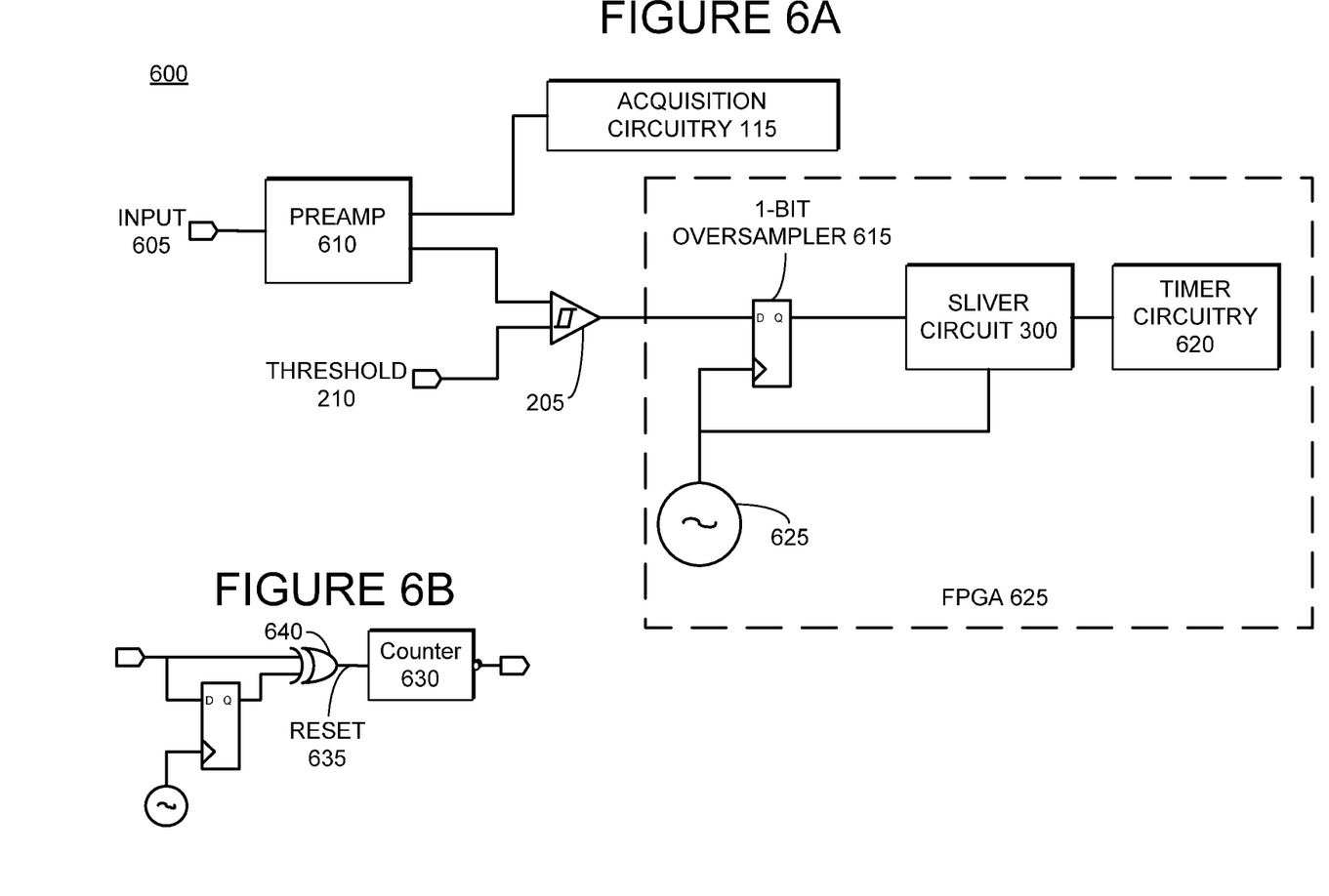
FIGS. 6A and 6B are simplified schematic representations of an oversampled 1-bit trigger system in accordance with embodiments of the subject invention.

FIGS. 6A and 6B are simplified schematic representations of an oversampled 1-bit trigger system 600 in accordance with embodiments of the subject invention. An input signal can be received at input terminal 605. A preamplifier 610 may be coupled to the input 605 to receive and amplify the signal under test. The amplified input signal may be transmitted to the acquisition circuitry 115 and/or an input of a comparator 205. The comparator 205 may be coupled to the preamplifier 610 to receive the amplified input signal, and to reference the amplified signal to a threshold voltage 210, such as ground. Here, the input signal is preferably a digital signal such that the output of the comparator 205 is similar to the input, although such need not always be the case; for instance, this embodiment can also be used with RF carriers, such as on/off keyed RF carriers where the input signal either has transitions (carrier present) or is quiescent (no carrier present). An oversampler circuit such as 1-bit oversampler 615 may be coupled to an output of the comparator 205. The oversampler 615 can produce an output signal having replicated digital values, as explained in more detail below.

An asynchronous reference clock 625 may be coupled to the oversampler 615. Preferably, the speed of the asynchronous reference clock is greater than the transition rate of the input signal received at 605. The output of the comparator 205 may be a digital signal that can be routed directly to digital circuitry, such as a field programmable gate array (FPGA) 625. The FPGA 625 is capable of oversampling the input. In some embodiments, a digital envelope detector 300 or 302 can be used to produce a logical HIGH output every time the input data changes. This output can be routed to timer circuitry 620. The timer circuitry 620 can include either digital or analog components to compare or otherwise process the time intervals between transitions of the envelope signal. The timer circuitry 620 can indicate a trigger event when a predefined threshold is exceeded. For example, the timer 620 may indicate a trigger event when a predefined number of zeroes is exceeded to isolate a "gap."

The output of the digital envelope detector 300 or 302 can be modified to extend its output pulse with a resettable counter 630, as shown in FIG. 6B. The counter 630 can receive a reset signal 635 from logic gate 640, and output a logical LOW when it has reached its programmed terminal count value. The logic gate 640 is representative of a digital envelope detector such as 300 or 302. The counter 630 can output a logical HIGH when it is in the act of counting. In some embodiments, the output of the counter 630 can be routed directly to an analog or digital timer circuit, such as timer circuitry 620. It should be understood that the circuit logic of FIG. 6B need not be construed in an overly narrow sense, and equivalent logic can be used to perform essentially the same or similar functions.

The following Table 1 represents various input and output data showing an exemplary operation.

| Input stream at 605: | 0 | 1 | 0 | 1 | 1 | 1 | 1 | 0... |
|---|---|---|---|---|---|---|---|---|
| Output of oversampler 615: | 0000 | 1111 | 0000 | 1111 | 1111 | 1111 | 1111 | 0000... |

| | | | | | | | | |
|---|---|---|---|---|---|---|---|---|
| Output of sliver circuit: | 0000 | 1000 | 1000 | 1000 | 0000 | 0000 | 0000 | 1000 . . . |
| Output of counter 630: | 0000 | 1111 | 1111 | 1111 | 0000 | 0000 | 0000 | 1111 . . . |

As shown in this example, the oversampler 615 can perform 4× oversampling of the input data stream. The sliver circuit can receive the output of the oversampler having the replicated digital values, and produce a logical HIGH output for one or more clock cycles for every transition of the input data. In other words, the sliver circuit can receive the output signal of the oversampler 615 having the replicated digital values, and produce a logical HIGH signal for each transition of the output signal of the oversampler 615. In addition, the counter 630 can extend a pulse, or digital value, received from the output of the digital sliver circuit, as shown above in Table 1.

An example of a "gap" is shown in the output of counter 630 in Table 1. Specifically, twelve consecutive zeroes form a gap, and the timer circuitry 620 can send out a trigger event if the twelve consecutive zeroes exceeds a predefined threshold. Furthermore, if a particular character is detected or not detected in the burst packet, such as the data shown in Table 1, then a message or violation can be displayed to the user of the oscilloscope 100. In some embodiments, the output signal can also be routed back to an analog timer.

Figure 7:
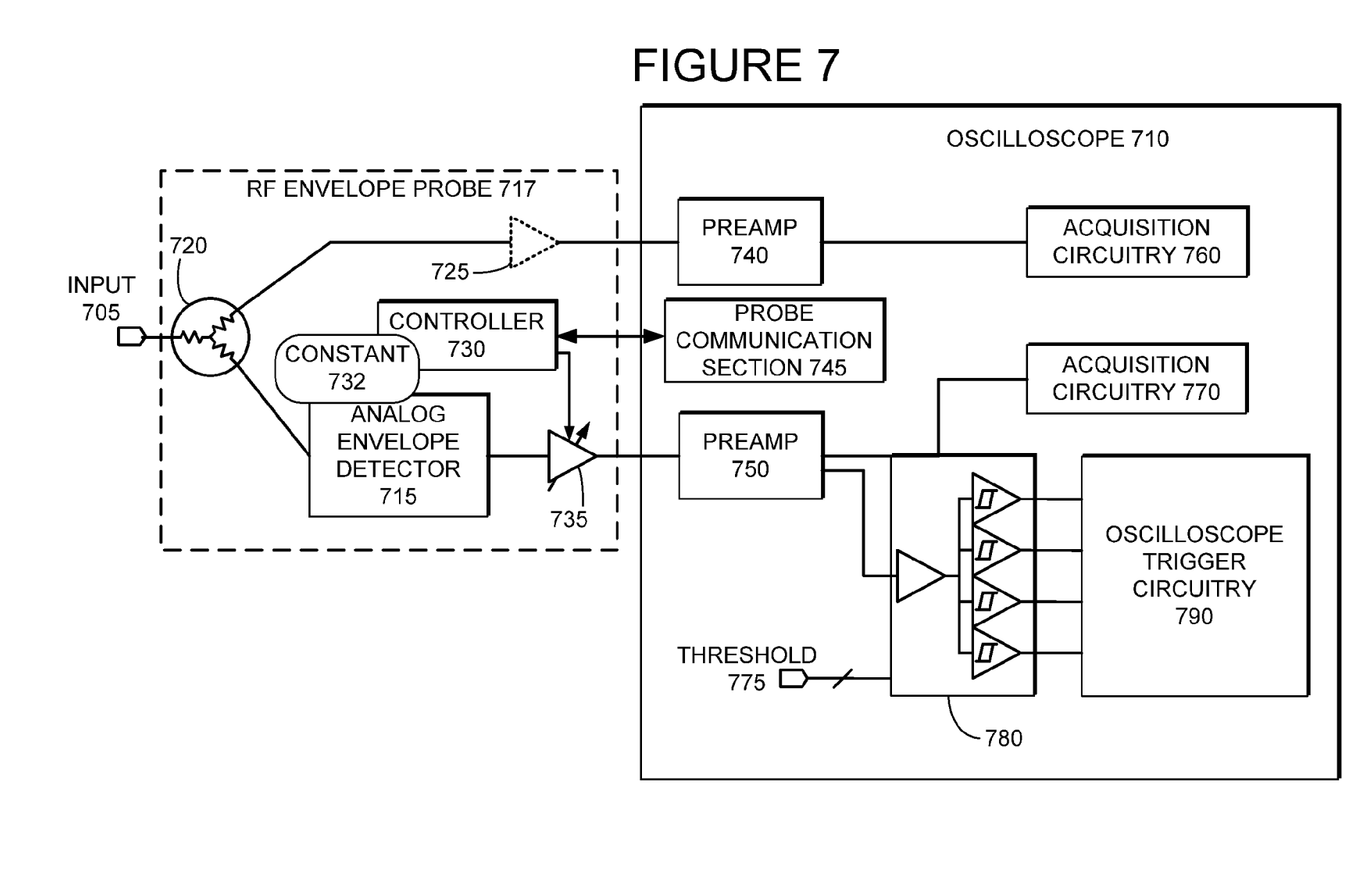
FIG. 7 illustrates an oscilloscope and an RF envelope probe attachable thereto, according to yet another embodiment of the invention.

FIG. 7 illustrates an oscilloscope 710 and an RF envelope probe 717 attachable thereto, according to yet another embodiment of the invention. The salient feature of an RF signal—the envelope of the RF carrier—is at a significantly lower bandwidth than the carrier itself. The components used in a radio transmitter to turn the RF carrier on and off may have bandwidths, for example, less than 2 GHz, one-tenth the frequency of the carrier itself. In addition, the similarity between the RF envelope and existing time-domain analog signals means that the trigger types developed for time-domain signals can be applied to the RF envelope. These may include signal types such as pulse width (either width of the burst or width of the gap between bursts), overshoot, rise and fall times, runt pulses, or excessive amplitude pulses, among other trigger types. The RF envelope can be extracted from the RF carrier and provided to a multi-functional oscilloscope trigger system.

The RF envelope probe 717 is discrete from and attachable to an input terminal of the oscilloscope 710. A power splitter 720 may be included in the RF envelope probe 717 to divide the signal under test into first and second signals. The power splitter 720 allows the oscilloscope 710 to acquire, display, and analyze both the actual signal input to the probe 717 as well as the envelope of the input signal. An analog envelope detector 715 may be included in the probe 717, which can receive the first signal and produce an envelope signal from the first signal. The oscilloscope is structured to receive and process both the envelope signal output from the envelope detector 715, and the divided second signal from the power splitter 720, which corresponds to the input signal.

The probe 717 can also include a controller 730 to operate with a probe communication section 745 of the oscilloscope 710. The controller 730 can be a microcontroller or other suitable processor. Communication between the oscilloscope 710 and the RF envelope probe 717 allows the oscilloscope to control the time constant 732 of the envelope detector 715, as well as the amount of gain in the variable gain stage. The time constant 732 can be adjusted to accommodate a wide range of input carrier frequencies. For example, when the input carrier signal has a higher frequency or otherwise higher modulation bounds, the envelope detector 715 must react more nimbly. On the other hand, when the input carrier signal has a lower frequency or otherwise lower modulation bounds, the envelope detector 715 does not necessarily need to discharge as quickly; thus, the controller 730 can adjust the time constant 732, which affects performance characteristics of the envelope detector 715.

Optionally, a variable gain amplifier 735 can be coupled to an output of the analog envelope detector 715 to enhance the gain or sensitivity of the envelope signal. The controller 730 can control an amount of gain in the variable gain amplifier 735. The variable gain stage can be used to account for the envelope detector sensitivity, which can be dependent on the carrier frequency. In other words, the amount of gain applied can depend on the operating frequency or the frequency of the input carrier waveform. The variable gain amplifier 735 extends the useable dynamic range over what would otherwise be available with the envelope detector 715 and preamplifier 750 alone.

In addition, the probe 717 may include an RF amplifier 725 to extend the input dynamic range of the coupled system, or to otherwise receive and amplify the second signal from the power splitter 720 before transmitting the second signal to the oscilloscope 710.

The oscilloscope 710 can include preamplifiers 740 and 750, acquisition circuitry 760 and 770, oscilloscope trigger circuitry 790, and a comparator block 780 disposed between the preamplifier 750 and the trigger circuitry 790. In some embodiments, the comparator block 780 is a single-channel comparator block. The oscilloscope 710 can also include diverse display and analysis hardware, as persons with skill in the art would understand. In addition, the oscilloscope 710 includes probe communication section 745 for communicating with probe 717.

Trigger circuitry 790 included in oscilloscope 710 may include dual-threshold circuitry. Dual-threshold circuitry includes multiple comparators and logic to simultaneously determine, for example, whether a signal is above a first threshold and not above a second threshold. As a result, a variety of trigger types can be applied to the signal.

Any of the components of the RF envelope probe 717 and the oscilloscope 710 may exist in or be implemented by hardware, software, firmware, or by any combination thereof.

The RF envelope probe 717 provides convenient enablement of new RF trigger types such as RF burst width, RF gap, RF envelope rise and fall times, among other possibilities. Trigger types such as rise time, fall time, runt and window preferably use the dual-threshold trigger system. An RF runt trigger type is particularly useful to find RF pulses with less than expected output power having intermittent behavior.

While FIG. 7 shows certain components disposed in RF envelope probe 717 and other components disposed in oscilloscope 710, such arrangement of components is not necessarily limited thereto. For instance, the probe 717 can be built into the oscilloscope 710 such that a user may present the RF input directly to the oscilloscope. The power splitter 720, envelope detector 715, amplifier 735, communication components, and so forth, can be disposed in the oscilloscope 710 rather than in the probe 717. Similarly, the probe 717 may comprise a modular device with the components of the RF envelope probe as illustrated plus additional components such as the preamplifiers 740 and 750. In other words, some of the components of the oscilloscope 710 such as the preamplifiers 740 or 750 can be disposed in the RF envelope probe 717. The modular device 717 can plug directly into the oscilloscope 710 and connect to the acquisition circuitry 760 and 770, the comparator block 780, or the trigger circuitry 790, through an interface.

The RF envelope probe 717 is not limited to receiving RF signals. For example, the RF envelope probe 717 can be used with systems employing high-speed serial data communication such as SATA and PCI Express®. Such high-speed data communication systems often turn transmitters off to save power. SATA in particular has a bus state known as Out of Bounds (OOB) signaling where short signaling pulses appear as bursts. In this situation, the "carrier" is the non-return-to-zero (NRZ) serial bit stream and the envelope of the bit stream pulses on and off. The RF envelope probe 717 in combination with the oscilloscope 710 can select particular OOB pulses of interest. Since the pulses may be spaced apart in time relative to the base bit rate, it is otherwise inefficient and costly to acquire and search the data using software based search algorithms.

Figure 8A:
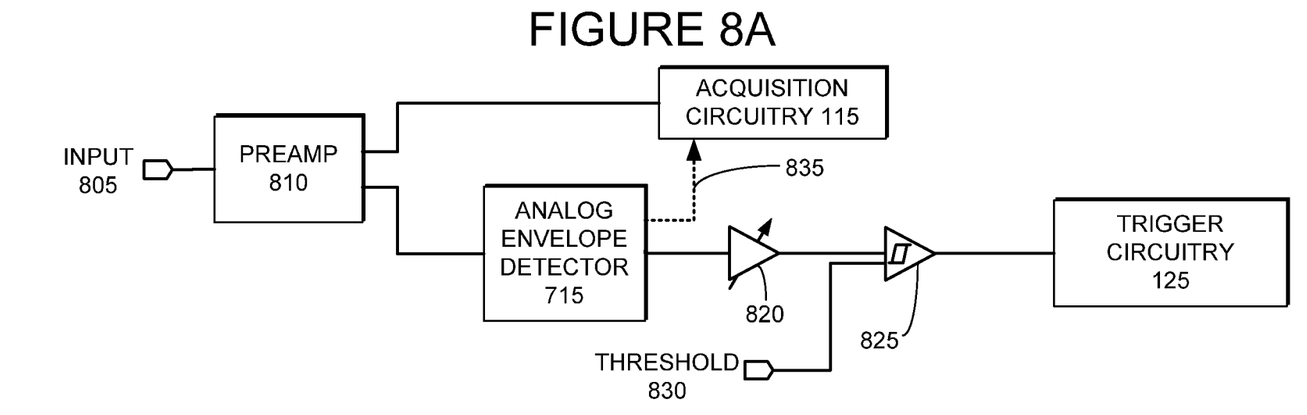
FIG. 8A shows an analog envelope detector in the signal path for the trigger circuitry in accordance with an embodiment of the subject invention.

FIG. 8A shows an analog envelope detector 715 in the signal path for the trigger circuitry 125 in accordance with an embodiment of the subject invention. The analog envelop detector 715 may include any analog envelope detector known in the art. The output voltage of the analog envelope detector 715 may be relatively small compared to the voltage level of input signal that is available. Thus, a variable gain amplifier 820 can be disposed in front of or to the output of the analog envelope detector 715. As a result, an improved signal range for the oscilloscope trigger circuitry 125 is provided. This also allows full use of the trigger circuitry 125. Meanwhile, the digital envelope detectors, such as 300 and 302 described above, can be used for other purposes.

A preamplifier 810 may be coupled to the input 805 to receive and amplify the signal under test. The amplified input signal may be transmitted to the acquisition circuitry 115 and/or an input of the analog envelope detector 715. The acquisition circuitry 115 can receive and process the signal under test. A variable gain amplifier 820 is coupled to an output of the analog envelope detector 715 to accommodate output gain variations. A comparator 825 is coupled to an output of the variable gain amplifier 820 and structured to reference the signal under test to a threshold voltage 830, such as ground. An output of the comparator is coupled to the trigger circuitry 125. The analog envelope detector 715 is disposed in the signal path for the trigger circuitry 125 before the comparator 825. In addition, the analog envelope detector 715 can be coupled to the acquisition circuitry 115 using connection 835 so that the envelope signal can be displayed to a user of oscilloscope 100.

Figure 8B:
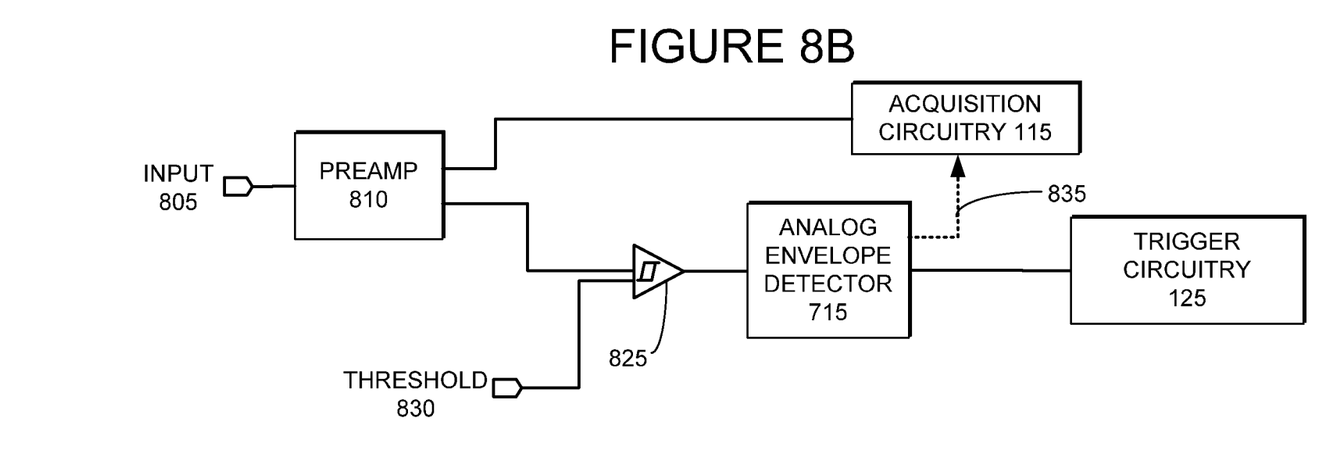
FIG. 8B shows an analog envelope detector disposed after the comparator in accordance with an embodiment of the subject invention.

FIG. 8B shows an analog envelope detector 715 disposed after the comparator 825 in accordance with an embodiment of the subject invention. The embodiment of FIG. 8B is similar to the one shown in FIG. 8A, and for the sake of brevity, some of the details will not be repeated. A notable difference is that the comparator 825 is coupled to the preamplifier 810. The comparator 825 is structured to receive the signal under test, and to remove a DC offset from the signal under test. An output of the comparator 825 is coupled to an input of the analog envelope detector 715, and an output of the analog envelope detector 715 is coupled to the trigger circuitry 125.

The embodiment shown in FIG. 8B can accommodate a significantly higher operating frequency since it is not limited by fixed-delay circuits. Moreover, the signal from the preamplifier 810 need not be AC coupled because the comparator 825 effectively removes the input signal DC offset and references the input to the threshold voltage 830, such as ground.

Either of the embodiments shown in FIG. 8A or 8B can include a controller (not shown) similar to that of controller 730 (of FIG. 7), which can adjust a time constant 732 of the envelope detector 715, as well as the amount of gain in the variable gain stage. The time constant can be adjusted to accommodate a wide range of input carrier frequencies. For example, when the input carrier signal has a higher frequency or otherwise higher modulation bounds, the envelope detector 715 must react more nimbly. On the other hand, when the input carrier signal has a lower frequency or otherwise lower modulation bounds, the envelope detector 715 does not necessarily need to discharge as quickly; thus, the controller 730 can adjust the time constant 732, which affects performance characteristics of the envelope detector 715.

Figure 9:
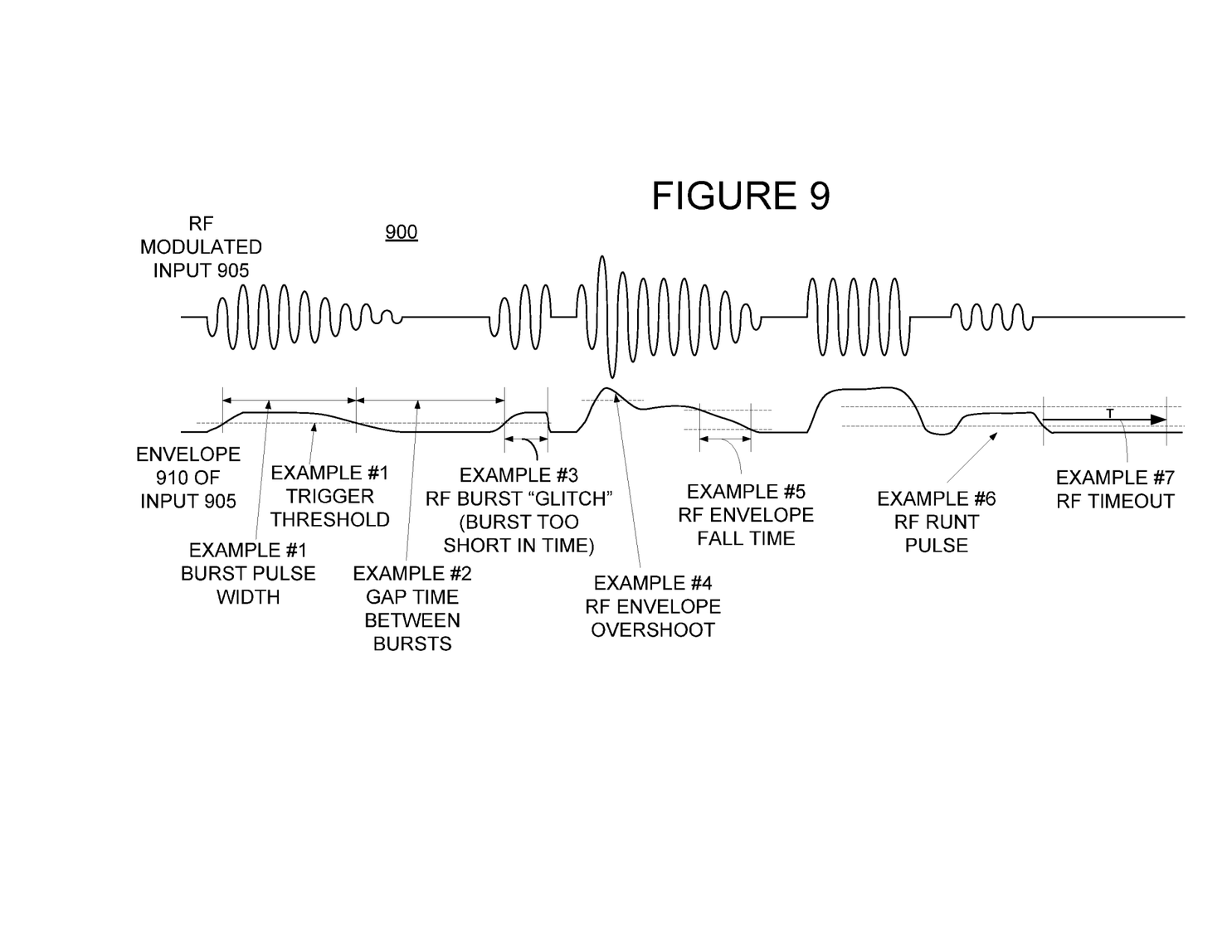
FIG. 9 is an illustration of waveforms useful in understanding the invention.

FIG. 9 is an illustration of waveforms 900 useful in understanding the invention. The amount of time that an RF carrier signal is on or off may follow some protocol rules, such as On/Off keying data transmission where the length of an RF burst can indicate how many logical "ones" were transmitted in a row. In addition, the characteristics of how the RF burst turns on or off can be dependent on the specific design of the radio transmitter. Just as regular time-domain signals have pulse characteristics of importance (width, rise time, fall time, overshoot, etc.), the envelope of the RF burst can have similar characteristics.

The diagram of FIG. 9 shows some example RF bursts of the RF modulated input 905 along with the associated envelope signal 910 of input 905. In example #1, the trigger threshold is set to a particular level by the user, and a burst is detected and/or isolated corresponding to the burst pulse width in the envelope signal. In example #2, a gap time between bursts is detected and/or isolated. In example #3, a burst "glitch" is detected and/or isolated. The burst glitch can correspond to a burst that is too short in time, or in other words, having a burst width that is less than a predefined width or range of widths. In example #4, an RF envelope overshoot is detected and/or isolated. In other words, the amplitude of the envelope signal exceeds a predefined threshold. In example #5, an RF envelope fall time is detected and/or isolated. In example #6, an RF runt pulse is detected and/or isolated. In example #7, an RF timeout is detected and/or isolated. In other words, the RF signal may in essence "disappear" and the RF timeout trigger type can detect such an event.

Although the above examples are shown consecutively one after the next, this is for illustrative purposes; it should be understood that these or similar conditions need not occur in the order illustrated. Indeed, any combination and order of bursts, gaps, and other events can occur, and can be isolated, analyzed, and displayed in accordance with the embodiments discussed herein.

Various types of triggers can be applied to isolate intervals of interest in the input signal using the analog envelope signal. In some embodiments, the trigger circuitry is structured to receive the envelope signal and to count a plurality of bursts in the signal under test corresponding to a plurality of pulses in the envelope signal. In other embodiments, the trigger circuitry is structured to isolate one of the plurality of bursts when the count exceeds a threshold. In another embodiment, the trigger circuitry is structured to receive the envelope signal and to isolate a burst glitch in the signal under test using the envelope signal. In still another embodiment, the trigger circuitry is structured to receive the envelope signal and to isolate a burst runt in the signal under test using the envelope signal.

In some embodiments, the trigger circuitry is structured to receive the envelope signal and to timeout after a period of time during which no burst is detected using the envelope signal. The trigger circuitry may be structured to receive the envelope signal and to isolate a fall time in the envelope signal. The fall time may be selected by the user to be within predetermined bounds, or outside of predetermined bounds. Similarly, the trigger circuitry may be structured to receive the envelope signal and to isolate a rise time in the envelope signal within or outside of predetermined bounds. In yet another example embodiment, the trigger circuitry is structured to receive the envelope signal and to cause a trigger event in association with the burst based on a trigger level set in relation to the envelope signal. It should be understood that other types of triggers, besides those explicitly mentioned, may be applied to the envelope signal to isolate sections of interest in the signal under test.

Figure 10A:
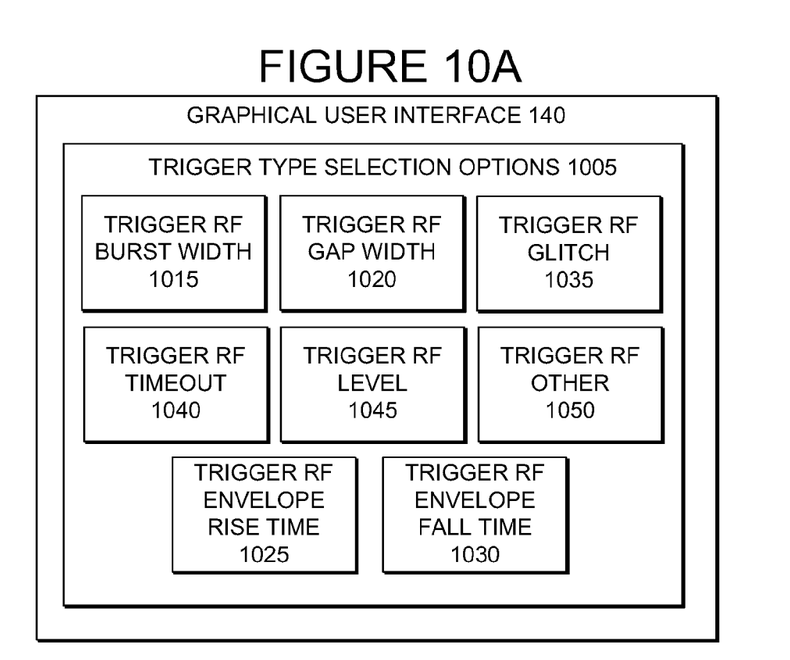
FIGS. 10A and 10B illustrate a representation of a graphical user interface including particular trigger type selection options, in accordance with embodiments of the invention.
Figure 10B:
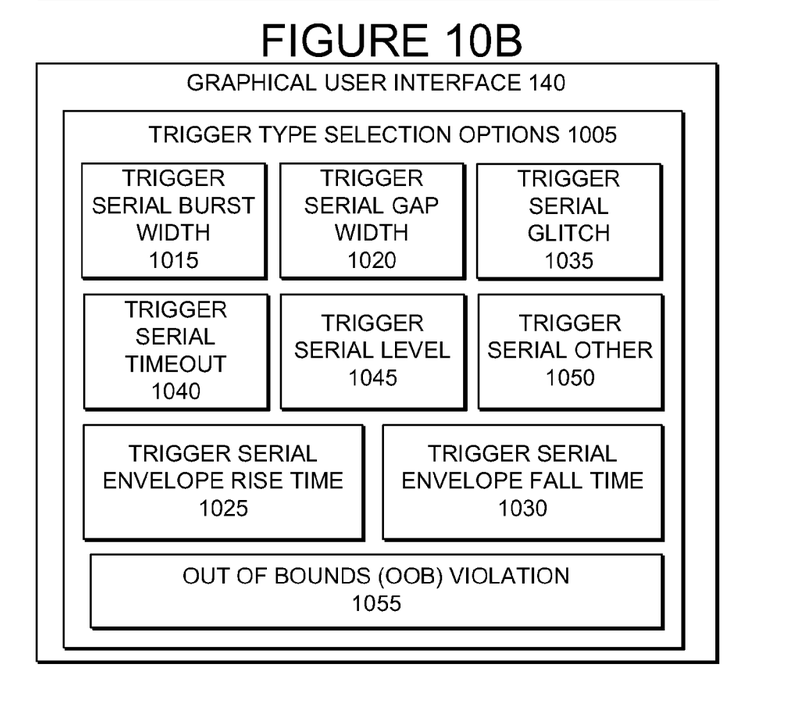

FIGS. 10A and 10B illustrate abstracted representations of a graphical user interface 140 including particular trigger type selection options 1005, in accordance with embodiments of the invention. The a graphical user interface (GUI) 140 can include a trigger type selection option having selections for at least one of (a) trigger RF burst width, (b) trigger RF gap width, (c) trigger RF envelope rise time, (d) trigger RF envelope fall time, (e) trigger RF glitch, (f) trigger RF timeout, and (g) trigger RF level. It should be understood that the GUI 140 can also include other RF trigger types 1050. The GUI 140 can be associated with user interface features of the Tektronix Pinpoint® triggering system. Alternatively, the GUI 140 can be separate from the user interface of the Pinpoint° system and provided to the user from a different menu option or section of the global user interface of the oscilloscope 100.

Subcombinations of the trigger type selections are possible. For example, the trigger RF burst width and trigger RF gap width may be the preferred trigger type selection options. Other trigger type selections may be emphasized or exposed to the user while others are not, based on different subcombinations or a particular level of software that is made available. The GUI 140 can also include a trigger type selection option having selections for at least one of (a) trigger serial burst width, (b) trigger serial gap width, (c) trigger serial envelope rise time, (d) trigger serial envelope fall time, (e) trigger serial glitch, (f) trigger serial timeout, and (g) trigger serial level. In addition, an Out of Bounds (OOB) violation 1055 selection can cause a message or other warning to the user of such a condition. This is particularly useful for SATA bus conditions, such as for identifying particular OOB pulses of interest. It should be understood that the GUI 140 can also include other serial trigger types 1050. Subcombinations of the serial trigger types can also be formed, or may be combined with the RF trigger types mentioned above.

Figure 11:
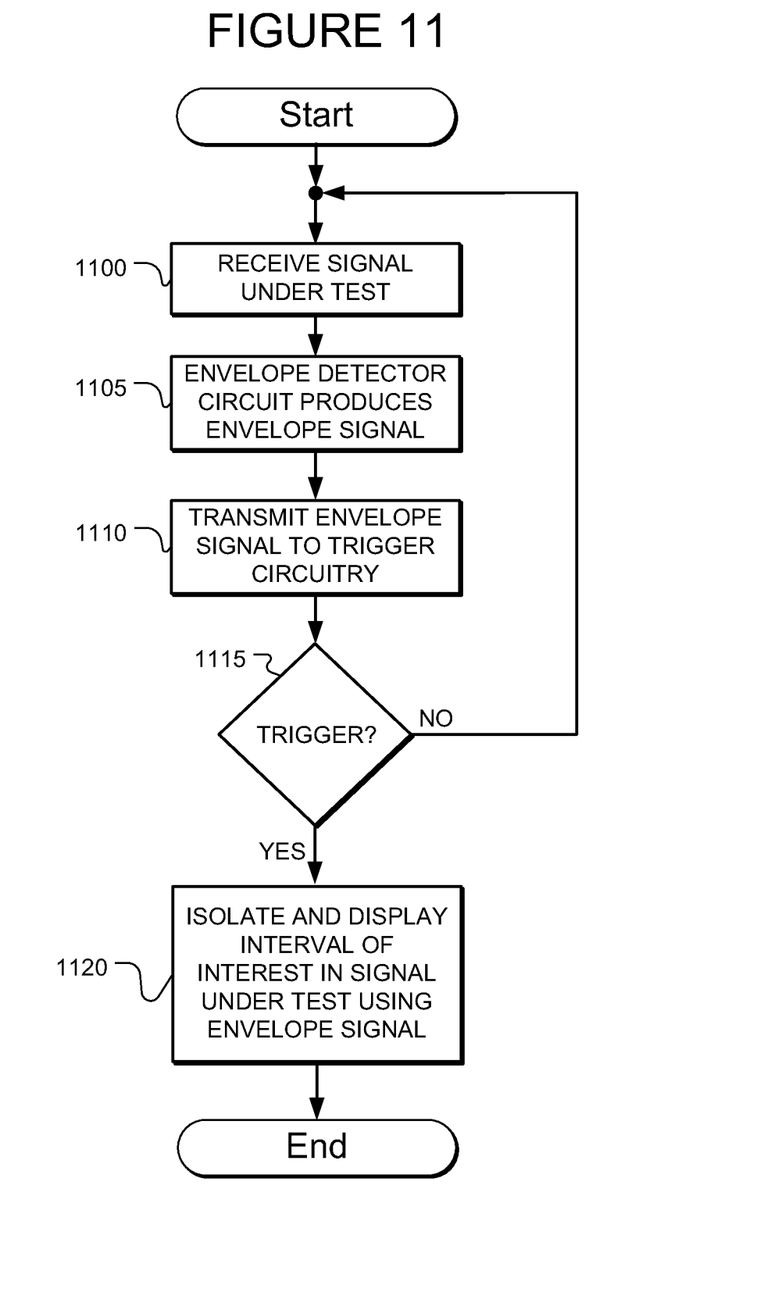
FIG. 11 is a flow diagram illustrating a technique for isolating an interval of interest in a signal under test.

FIG. 11 is a flow diagram illustrating a technique for isolating an interval of interest in a signal under test. The flow diagram begins at 1100 when an electrical signal under test is received by the oscilloscope or a probe of the oscilloscope. At 1105, an envelope detector circuit receives the signal under test and produces an envelope signal from the signal under test. The flow then proceeds to 1110 where the envelope signal is transmitted to trigger circuitry of the oscilloscope. Various trigger types can be applied to the envelope signal. A determination is made at 1115 whether the trigger criteria has been met. If yes, the flow proceeds to 1120 and the interval of interest in the signal under test is isolated using the envelope signal as the trigger. The envelope signal and/or the signal under test may be displayed individually or simultaneously.

Although particular embodiments have been described, it will be appreciated that the principles of the invention are not limited to those embodiments. For example, although in some embodiments mentioned above, the high bit rate or frequency of the carrier can exceed the trigger performance when the frequency of the carrier is above around 12 GHz. In other embodiments, the carrier may exceed more complex trigger performance when the frequency of the carrier is between about 1.5 and 3 GHz, or the bit rate is between about 3 and 6 Gbps. Even under these conditions, the embodiments of the invention can trigger on the envelope and isolate bursts and gaps in the input signal. As another example, programmable sliver length allows support for slower carrier frequency or bit rate. In some embodiments, an article drawn from the set including floppy disks, optical disks, fixed disks, random access memory, read-only memory, or flash memory, comprising a machine-accessible medium having associated instructions that, when executed in a test and measurement device, results in a machine performing the steps of the various embodiments of the invention as disclosed herein. Other variations and modifications may be made without departing from the principles of the invention as set forth in the following claims.

The invention claimed is:

1. A test and measurement system, comprising:
an oscilloscope including trigger circuitry; and
an envelope probe attachable to an input terminal of the oscilloscope, wherein the envelope probe comprises:
a power splitter to divide a signal under test into first and second signals; and
an envelope detector analog circuit to receive the first signal and to produce an envelope signal from the first signal, wherein the oscilloscope is structured to receive and process the envelope signal and the second signal, and the trigger circuitry is structured to receive and process the envelope signal.

2. The test and measurement system of claim 1, wherein the envelope probe further comprises:
a microcontroller to operate with a probe communication section of the oscilloscope; and
a variable gain amplifier to receive the envelope signal from the envelope detector, wherein the microcontroller is structured to control an amount of gain in the variable gain amplifier.

3. The test and measurement system of claim 2, wherein the microcontroller is structured to control a time constant of the envelope detector.

4. The test and measurement system of claim 3, wherein the envelope probe further comprises a Radio Frequency (RF) amplifier to receive and amplify the second signal before transmitting the second signal to the oscilloscope.

* * * * *